United States Patent
Bulatowicz et al.

(10) Patent No.: US 10,330,696 B2
(45) Date of Patent: Jun. 25, 2019

(54) ACCELEROMETER SENSOR SYSTEM

(71) Applicants: Michael D. Bulatowicz, Sun Prairie, WI (US); Robert C. Griffith, Woodland Hills, CA (US); Henry C. Abbink, Westlake Village, CA (US); Daryl K. Sakaida, Simi Valley, CA (US); Philip R. Clark, Charsworth, CA (US)

(72) Inventors: Michael D. Bulatowicz, Sun Prairie, WI (US); Robert C. Griffith, Woodland Hills, CA (US); Henry C. Abbink, Westlake Village, CA (US); Daryl K. Sakaida, Simi Valley, CA (US); Philip R. Clark, Charsworth, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 521 days.

(21) Appl. No.: 15/079,207

(22) Filed: Mar. 24, 2016

(65) Prior Publication Data

US 2017/0276698 A1 Sep. 28, 2017

(51) Int. Cl.
  *G01P 15/08* (2006.01)
  *G01P 15/13* (2006.01)
  *G01P 15/125* (2006.01)

(52) U.S. Cl.
  CPC ........ *G01P 15/131* (2013.01); *G01P 15/0802* (2013.01); *G01P 15/125* (2013.01);
  (Continued)

(58) Field of Classification Search
  CPC ... G01P 15/125; G01P 15/131; G01P 15/0802
  See application file for complete search history.

(56) References Cited

U.S. PATENT DOCUMENTS

| 4,679,434 A | * | 7/1987 | Stewart | ............... G01P 15/0802 |
| | | | | 403/291 |
| 5,142,921 A | * | 9/1992 | Stewart | ................. G01P 15/131 |
| | | | | 73/514.18 |

(Continued)

FOREIGN PATENT DOCUMENTS

| EP | 2778692 A1 | 9/2014 |
| JP | 03094168 A | 4/1991 |

(Continued)

OTHER PUBLICATIONS

Japanese Office Action corresponding to Japanese Application No. 2017-057480, dated Feb. 26, 2018.

(Continued)

*Primary Examiner* — Helen C Kwok
(74) *Attorney, Agent, or Firm* — Tarolli, Sundheim, Covell & Tummino LLP

(57) ABSTRACT

Embodiments of the invention include an accelerometer system. The system includes an accelerometer sensor comprising first and second electrode configurations and an inertial mass between the first and second electrode configurations. In one example, the accelerometer sensor being fabricated as symmetrically arranged about each of three orthogonal mid-planes. The system also includes an accelerometer controller configured to apply control signals to each of the first and second electrode configurations to provide respective forces to maintain the inertial mass at a null position between the first and second electrode configurations. The accelerometer controller can measure a first pickoff signal and a second pickoff signal associated with the respective first and second electrode configurations. The first and second pickoff signals can be indicative of a displacement of the inertial mass relative to the null position. The (Continued)

accelerometer controller can calculate an acceleration based on the first and second pickoff signals.

19 Claims, 6 Drawing Sheets

(52) U.S. Cl.
CPC .............. *B81B 2201/0235* (2013.01); *B81B 2203/0109* (2013.01); *G01P 2015/0837* (2013.01)

(56) References Cited

U.S. PATENT DOCUMENTS

| | | | |
|---|---|---|---|
| 6,308,569 B1 | 10/2001 | Stewart | |
| 9,156,673 B2* | 10/2015 | Bryzek | H01L 29/84 |
| 2006/0125351 A1* | 6/2006 | Robinson | H03H 9/0514 |
| | | | 310/340 |
| 2006/0150735 A1* | 7/2006 | Fax | G01P 15/125 |
| | | | 73/514.18 |
| 2007/0029654 A1* | 2/2007 | Sunohara | B81C 1/00301 |
| | | | 257/678 |
| 2008/0295597 A1* | 12/2008 | Stewart | G01P 15/125 |
| | | | 73/514.18 |
| 2010/0116054 A1* | 5/2010 | Paulson | G01P 15/125 |
| | | | 73/514.32 |
| 2010/0259285 A1* | 10/2010 | Koli | G01P 15/125 |
| | | | 324/686 |
| 2011/0067495 A1* | 3/2011 | Yu | G01P 15/0888 |
| | | | 73/514.24 |
| 2012/0090393 A1* | 4/2012 | Montanya Silvestre | |
| | | | G01P 15/00 |
| | | | 73/514.18 |
| 2014/0236522 A1* | 8/2014 | Bulatowicz | G01P 15/125 |
| | | | 702/104 |
| 2014/0260618 A1* | 9/2014 | Ocak | G01P 15/131 |
| | | | 73/514.39 |
| 2014/0374847 A1 | 12/2014 | Hrovat | |
| 2015/0188024 A1* | 7/2015 | Ishigami | H01L 41/0475 |
| | | | 310/344 |
| 2015/0208507 A1* | 7/2015 | Walmsley | B81B 7/0048 |
| | | | 361/783 |
| 2016/0202366 A1* | 7/2016 | Ocak | G01P 15/131 |
| | | | 73/514.32 |

FOREIGN PATENT DOCUMENTS

| | | |
|---|---|---|
| JP | 05026903 A | 5/1993 |
| JP | 2008528968 A | 7/2008 |
| JP | 2011075482 A | 4/2011 |
| JP | 2015003381 A | 8/2015 |
| WO | 2015140537 A1 | 9/2015 |

OTHER PUBLICATIONS

European Search Report for corresponding EP 17 16 1707, dated Aug. 31, 2017.

Japanese Office Action corresponding to Japanese Application No. 2017-057480 dated Nov. 5, 2018.

* cited by examiner

ACCELEROMETER SENSOR SYSTEM

TECHNICAL FIELD

This disclosure relates generally to sensor systems, and specifically to an accelerometer sensor system.

BACKGROUND

In a force balanced sensing instrument, such as an accelerometer for example, it is generally desired that the instrument output signal be proportional to the input condition to be sensed. Therefore, in many types of electrostatic and electromagnetic force balanced sensing instruments special techniques are required to obtain a linear relation between the instrument output and the sensed input. In electrostatic and electromagnetic instruments, the forces applied by the instrument forcer are not linearly related to the feedback voltage or current supplied to the forcer. Furthermore, for optimum operation of the instrument itself it is preferred that the feedback force applied by the feedback control network have a linear relation to the sensed input. Thus, special techniques have been employed for obtaining such linearity.

As one example, in an electrostatic force balanced accelerometer, electrostatic forcing in a closed loop system is employed to position and obtain an output from an inertial mass or proof mass. The electrostatic forcing system employs a capacitive pickoff electrode on each side of a pendulous member that has been etched from a silicon substrate. A control pulse is employed to sequentially apply a constant amount of charge to each electrode. A variable force is applied to the inertial mass by varying the amount of time (e.g., duty cycle) the charge is left on a respective plate. The amount of time the charge is left on a respective plate is based on the displacement of the inertial mass relative to a null position.

Therefore, the feedback system in a given accelerometer mechanization is designed to equalize the measured capacitance on both sides of the inertial mass to maintain the inertial mass at the null position. As a result, the proof mass is moved to the position required to equalize the measured capacitance, regardless of how much displacement this causes relative to the suspension. It is typically assumed that when the capacitances are equal on both sides of the inertial mass, the accelerometer forms a pair of parallel-plate capacitors. However, a number of mechanical and electrical factors can contribute to a non-uniform distribution of charge and/or an error in the magnitude of the effective applied charge on the pickoff electrodes on either side of the inertial mass, thus resulting in errors in the measurement of the specific force input to the inertial mass by an external influence, such as acceleration.

SUMMARY

One embodiment of the invention includes an accelerometer system. The system includes an accelerometer sensor comprising first and second electrode configurations and an inertial mass between the first and second electrode configurations. In one example, the accelerometer sensor being fabricated as symmetrically arranged about each of three orthogonal mid-planes. The system also includes an accelerometer controller configured to apply control signals to each of the first and second electrode configurations to provide respective forces to maintain the inertial mass at a null position between the first and second electrode configurations. The accelerometer controller can measure a first pickoff signal and a second pickoff signal associated with the respective first and second electrode configurations. The first and second pickoff signals can be indicative of a displacement of the inertial mass relative to the null position. The accelerometer controller can calculate an acceleration based on the first and second pickoff signals.

Another embodiment of the invention includes an accelerometer system. The system includes an integrated circuit (IC) chip configured as an accelerometer sensor comprising a first electrode configuration, a second electrode configuration, and an inertial mass between the first and second electrode configurations. The system also includes an accelerometer controller configured to apply control signals to each of the first and second electrode configurations to provide respective forces to maintain the inertial mass at a null position between the first and second electrode configurations. The accelerometer controller can be further configured to measure a first pickoff signal and a second pickoff signal associated with the respective first and second electrode configurations, the first and second pickoff signals being indicative of a displacement of the inertial mass relative to the null position, and to calculate an acceleration based on the first and second pickoff signals. The system can also include a mounting interposer on which the IC chip is mounted via a mechanically compliant adhesive along a first plane that separates the IC chip and the mounting interposer, the adhesive being arranged in a pattern that is symmetric about two orthogonal planes that are orthogonal to the first plane. The system can further include an accelerometer case that at least partially encloses the IC chip, the accelerometer controller, and the mounting interposer, the mounting interposer being mounted on a surface of the accelerometer case via the mechanically compliant adhesive, such that the mounting interposer interconnects the IC chip and the accelerometer case.

Another embodiment of the invention includes a method for calculating an acceleration. The method includes providing a charge to each of a first electrode assembly and a second electrode assembly associated with an accelerometer sensor based on a first voltage having a positive amplitude. The first and second electrode assemblies can be arranged opposite an inertial mass. The method also includes measuring first pickoff voltages associated with the respective first and second electrode assemblies in a first measurement cycle. The method also includes providing a charge to the first and second electrode assemblies based on a second voltage having an amplitude that is equal and opposite the first voltage. The method also includes measuring second pickoff voltages associated with the respective first and second electrode assemblies in a second measurement cycle. The method also includes calculating an average of differences between the respective first and second pickoff voltages associated with each of the first and second measurement cycles. The method further includes calculating a displacement of the inertial mass resulting from the acceleration.

Yet another embodiment of the invention includes an accelerometer system. The system includes an accelerometer sensor comprising a first electrode configuration, a second electrode configuration, and an inertial mass between the first and second electrode configurations. The system also includes an accelerometer controller. The accelerometer controller includes a signal generator comprising a first charge amplifier system configured to generate a first voltage to provide a first charge on the first electrode assembly in response to an input voltage and a second charge amplifier system configured to generate a second voltage to provide a second charge on the second electrode assembly in response to the input voltage to maintain the inertial mass at a null position between the first and second electrode configurations. Each of the first and second charge amplifier systems comprising a first amplifier and a second amplifier in a cascaded arrangement. The accelerometer controller also includes an acceleration processor configured to calculate an acceleration based on a first pickoff signal associated with the first charge and a second pickoff signal associated with the second charge. The first and second pickoff signals can be indicative of a displacement of the inertial mass relative to the null position.

DETAILED DESCRIPTION

Figure 1:
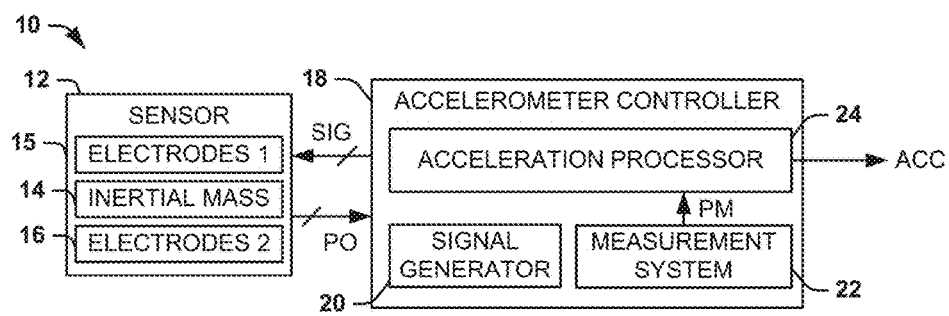
FIG. 1 illustrates an example of an accelerometer system.

This disclosure relates generally to sensor systems, and specifically to an accelerometer sensor system. An accelerometer sensor system can include a sensor that comprises an inertial mass (e.g., a proofmass) and an electrode configuration (e.g., on either side of the inertial mass). The sensor can provide pickoff signals (e.g., acceleration feedback signals) in response to control signals (e.g., provided as controlled charge) that are provided to the inertial mass and/or electrodes, with the pickoff signals being indicative of displacement of the inertial mass resulting from external acceleration. The accelerometer sensor system also includes an acceleration controller that is configured to calculate a magnitude of the input acceleration acting upon the accelerometer system based on the pickoff signals. The accelerometer controller includes a signal generator that is configured to generate the control signals and a measurement system configured to measure the pickoff signals.

Each of the electrode configurations corresponds to a parallel-plate capacitor with respect to the inertial mass, such that the applied charge can be measured as a voltage corresponding to the pickoff signals. The voltages can be based on the capacitance of the parallel-plate capacitor associated with the respective one of the electrode configurations and the inertial mass. Thus, when the capacitances are equal on both sides of the inertial mass with respect to the electrode configurations, it is assumed that inertial mass is at an electrical null position corresponding to equal voltages on each side of the inertial mass (e.g., with respect to the first and second electrode configurations). However, a number of mechanical and electrical factors can contribute to a non-uniform distribution of charge on the electrode configurations on either side of the inertial mass. As a result, errors can exhibit in the measurement of the capacitances on both sides of the inertial mass. Such errors can interfere with a proper measure of the displacement of the inertial mass from the null position, and can thus appear as components of external acceleration.

The accelerometer system can have a variety of features to substantially mitigate non-uniform charge distribution of the charge on the electrode configurations. As one example, the accelerometer sensor can be fabricated as a multi-layer silicon structure (e.g., an integrated circuit) that can be arranged as symmetric about each of three orthogonal midplanes. The electrode configurations can be provided with electrical connections that are likewise symmetric to provide a substantially uniform charge distribution across the electrode configurations. Additionally, the accelerometer system can be fabricated in a manner to substantially mitigate mechanical and thermal stresses, such as based on implementing a mounting interposer between the IC of the accelerometer sensor and the accelerometer case via an adhesive arranged in a pattern that is symmetric about two orthogonal planes. In addition, to likewise substantially mitigate errors, the charge that is provided to the electrode configurations can be provided in a sequential manner based on an alternating positive and negative voltage (e.g., equal and opposite zero amplitude), with the differences in the pickoff signals between the electrode configurations being averaged. Furthermore, the signal generator can include first and second charge amplifier systems that are each arranged as a pair of cascaded amplifiers to provide the charge on the electrode configurations of the accelerometer sensor, such as based on a switching system that sequentially provides an input voltage to an input of each of the first and second charge amplifier systems. Therefore, sources of error resulting from a non-uniform charge distribution can be substantially mitigated.

FIG. 1 illustrates an example of an accelerometer system 10 in accordance with an aspect of the invention. The accelerometer system 10 can be implemented in any of a variety of applications, such as for navigation and/or guidance systems. As an example, the accelerometer system 10 can be arranged in an accelerometer case as part of an instrument block corresponding to a navigation system. The accelerometer system 10 can be configured to measure an external input acceleration acting upon the accelerometer system 10, demonstrated in the example of FIG. 1 as a signal ACC. As described herein, an external acceleration or input acceleration is defined as an acceleration of the accelerometer system 10 resulting from an external force that is applied to the accelerometer system 10, and can include gravity as well as accelerations resulting from other external forces. As described herein, the accelerometer system 10 can be configured to calculate the external acceleration ACC in a manner that substantially mitigates errors, such as associated with a non-uniform charge distribution.

The accelerometer system 10 includes an accelerometer sensor 12. As an example, the accelerometer sensor 12 can be configured as an integrated circuit (IC), such that the accelerometer sensor 12 can be fabricated as a chip. The accelerometer sensor 12 includes an inertial mass 14, a first electrode configuration 15, and a second electrode configuration 16, such that the inertial mass 14 is disposed between the electrode configurations 15 and 16. The inertial mass 14 can be arranged such that the inertial mass 14 is forced in a direction opposite the external acceleration. The accelerometer system 10 also includes an accelerometer controller 18. The accelerometer controller 18 includes a signal generator 20, a measurement system 22, and an acceleration processor 24. The signal generator 20 is configured to generate control signals SIG that are provided to the respective electrode configurations 16 for maintaining the inertial mass 14 at a substantial electrical null position in a force rebalance manner. The measurement system 22 is configured to measure pickoff signals, demonstrated in the example of FIG. 1 as signals PO, that are associated with a capacitance of the respective electrode configurations 15 and 16 relative to the inertial mass 14, and can thus provide an indication of displacement of the inertial mass 14, demonstrated as a signal PM, to the acceleration processor 24. The acceleration processor 24 can thus control the signal generator 20 to implement the force rebalance of the inertial mass 14, such as by adjusting one or more of an amplitude, a polarity, a duration, and a duty-cycle of the control signals SIG based on the force rebalance implementation. Therefore, the acceleration processor 24 can be configured to calculate the input acceleration ACC of the accelerometer system 10 in response to a force acting upon the inertial mass 14 based on the force rebalance of the inertial mass 14 to the null position.

As one example, the signal generator 20 can generate charge pulses (e.g., current pulses) of a substantially equal and opposite amplitude, and the acceleration processor 24 is configured to provide the charge pulses to the electrode configurations 15 and 16 in a predetermined sequence to generate electrostatic forces to accelerate the inertial mass 14 toward the respective null position (e.g., to rebalance the inertial mass 14). For example, the acceleration processor 24 can alternately provide charge pulses generated by the signal generator 20 to the first electrode configuration 15 then to the second electrode configuration 16 to generate alternating electrostatic forces of opposite polarity. As a result, the inertial mass 14 is alternately accelerated in the first and second directions to position the inertial mass 14 toward the null position at each charge pulse application. In response to an external force, the acceleration processor 24 can be configured to change a duty-cycle of the current pulses corresponding to the control signals SIG in a pulse-width modulation (PWM) manner to apply a greater rebalance force to one side of the respective inertial mass 14.

As a result of a capacitive coupling between the respective electrode configurations 15 and 16 and the inertial mass 14, the pickoff signals PO are generated at the electrode configurations 15 and 16 that are an indication of the relative displacement of the inertial mass 14. The pickoff signals PO can thus be a function of a displacement (e.g., capacitive gap) of the inertial mass 14 relative to the respective electrode configurations 15 and 16. Accordingly, the pickoff signals PO can provide an indication of a magnitude of the relative displacement of the inertial mass 14. The measurement system 22 can be configured to generate the signal PM that corresponds to the displacement of the inertial mass 14 and/or a time integral of the displacement of the inertial mass 14 based on the pickoff signals PO, such as resulting from an external acceleration. The acceleration processor 24 can thus be configured to calculate the magnitude of the external acceleration ACC based on the output signals PM.

The operation of the accelerometer system 10, as described previously, is based on ideal fabrication and operational conditions. However, for a typical accelerometer system, inappropriate assumptions are often set forth regarding the geometry of a given accelerometer sensor and the method of feedback to keep a respective inertial mass stable (closed-loop force-rebalance accelerometers) and/or the method of measurement of displacement of the inertial mass (open-loop accelerometers). In the example of an out-of-plane type of accelerometer, the most common assumption is that the electrode-to-inertial mass interface forms a parallel-plate capacitor. This assumption can lead to substantial simplification of the mathematics involved in analysis of the instrument, and can provide for a reasonable first-order estimate of the accelerometer performance characteristics. However, the assumption of flat parallel planes for the proof mass and electrode can be faulty. High-precision measurements of the physical geometry of a given accelerometer sensor can reveal that the assumption of the parallelism is often quite poor. As an example, distortion of an individual accelerometer sensor with respect to the inertial mass-to-electrode gap can be as great as 10% or more of the nominal gap. This distortion can substantially invalidate the assumption of parallel plates in the capacitive gap of a given accelerometer sensor. Sources of the distortion at chip level can include wafer fabrication tolerances such as bow, warp, and thickness variation as well as residual stress in the wafer resulting from the fabrication process. Another source of distortion at the chip level can include the thermal expansion coefficient mismatch between the materials comprising the chip (for example, silicon and silicon dioxide).

Distortion of the given accelerometer sensor can lead to discrepancies in the electrical null, such as resulting in bias errors. Additionally, the distortion can modify the electrical charge distribution on the electrodes and the inertial mass, such as resulting in a non-uniform charge distribution on the respective electrodes. Such non-uniform charge distribution can result in a change in applied electrostatic force per unit charge (or per unit voltage) on the electrode as a whole as compared to parallel, flat surfaces with uniform charge distribution. Furthermore, the non-uniform electrical charge distribution can result in a non-uniform distribution of force between the electrode and proof mass (for a force-rebalance type of accelerometer), leading to an applied net torque in addition to the applied force. Furthermore, thermal expansion coefficient differences between various materials can lead to temperature sensitivity of the distortion of the chip, resulting in temperature-sensitive changes in torque and force applied to the inertial mass per unit charge, as well as a potential change in the direction of the sensitive axis of the accelerometer system, resulting in misalignment over temperature. All of these factors can thus contribute to errors in a measured acceleration. As described herein, the accelerometer system 10 can include a variety of features that can substantially mitigate errors in the measured acceleration ACC.

Figure 2:
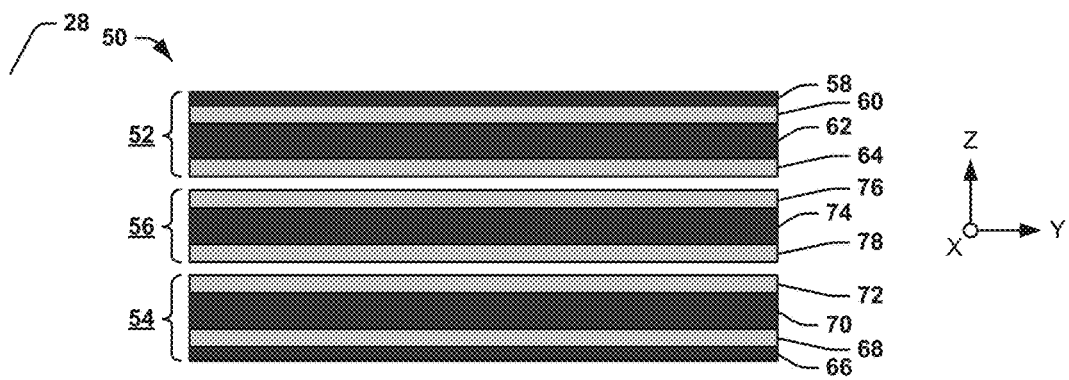
FIG. 2 illustrates an example diagram of a wafer assembly.

FIG. 2 illustrates an example diagram of a wafer assembly 50. The wafer assembly 50 can correspond to an initial stage in fabrication of an accelerometer sensor, such as the accelerometer sensor 12 in the example of FIG. 1. The wafer assembly 50 includes a first wafer layer 52, a second wafer layer 54, and a third wafer layer 56. The first wafer layer 52 can correspond to a first portion of the accelerometer sensor 12 that includes the first electrode configuration 15, and the second wafer layer 54 can correspond to a second portion of the accelerometer sensor 12 that includes the second electrode configuration 16. The third wafer layer 56 can correspond to a portion of the accelerometer sensor 12 that includes the inertial mass 14.

The wafer assembly 50 is demonstrated in the example of FIG. 2 in a cross-sectional view in a Y-Z plane. In the example of FIG. 2, the first and second wafer layers 52 and 54 are fabricated as silicon-on-insulator (SOI) wafer layers.

For example, the first wafer layer 52 includes a first silicon layer 58, an oxide layer 60, a second silicon layer 62, and a silicon-dioxide layer 64. Similarly, the second wafer layer 54 includes a first silicon layer 66, an oxide layer 68, a second silicon layer 70, and a silicon-dioxide layer 72. Thus, the second wafer layer 54 is demonstrated as inverted relative to the first wafer layer 52. The third wafer layer 56 includes a semiconductor (e.g., silicon) layer 74 that interconnects a first silicon-dioxide layer 76 and a second silicon-dioxide layer 78. The wafer layers 52, 54, and 56 can thus be etched and/or otherwise processed to form the accelerometer sensor 12. As described herein, the wafer assembly 50 can be fabricated to form an IC chip corresponding to an accelerometer sensor.

Figure 3:
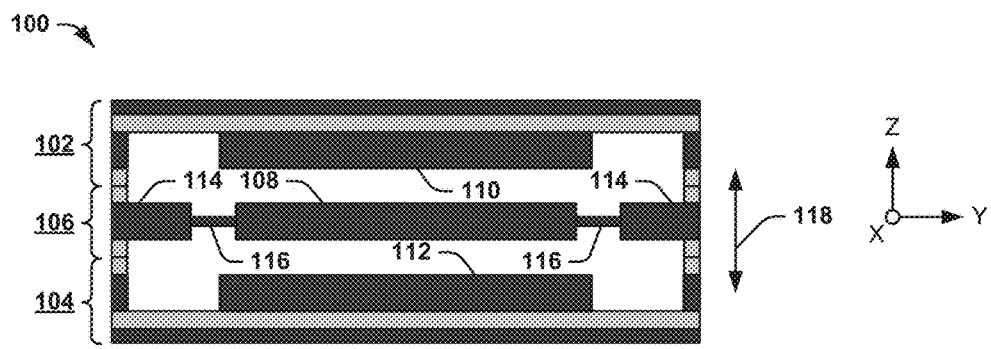
FIG. 3 illustrates an example of an accelerometer sensor.

FIG. 3 illustrates an example of an accelerometer sensor 100. The accelerometer sensor 100 can correspond to the wafer assembly 50 having undergone etching and/or other processing steps to fabricate a finished accelerometer sensor. The accelerometer sensor 100 includes a first layer 102 that can correspond to an etched and/or processed first wafer layer 52, a second layer 104 that can correspond to an etched and/or processed second wafer layer 54, and a third layer 106 that can correspond to an etched and/or processed third wafer layer 56. As an example, the accelerometer sensor 100 can correspond to the accelerometer sensor 12 in the example of FIG. 1. Therefore, the accelerometer sensor 100 can be fabricated as an IC chip. Accordingly, reference is to be made to the examples of FIGS. 1 and 2 in the following description of the example of FIG. 3.

The accelerometer sensor 100 includes an inertial mass 108, a first electrode configuration 110, and a second electrode configuration 112. The first and second electrode configurations 110 and 112 are arranged on opposing surfaces of the inertial mass 108. As described herein, an electrode configuration can correspond to one or more electrodes, such that the first and second electrode configurations 110 and 112 can each be arranged as a single electrode or as set of plural electrodes. The inertial mass 108 is coupled to a frame 114 of the accelerometer sensor 100 via a set of flexures 116. The frame 114 can correspond to portions of each of the first, second, and third layers 102, 104, and 106. The flexures 116 are configured in the example of FIG. 3 can be configured as a set of flexures that are arranged at each peripheral surface of the inertial mass 108 in a symmetric manner about two orthogonal mid-planes. Therefore, motion of the inertial mass 108 up and down along an input axis 118 can be maintained in a substantially planar motion with respect to the frame 114, such that an angle between the inertial mass 108 relative to the first and second electrode configurations 110 and 112, which is nominally zero, can remain substantially constant to substantially avoid wedge-effects that can affect the scale-factor and/or bias of the accelerometer sensor 100. As an example, based on the etching and/or fabrication processing of the first, second, and third layers 102, 104, and 106 (e.g., from the respective wafer layers 52, 54, and 56), the inertial mass 108, the first electrode configuration 110, and the second electrode configuration 112 can be fabricated as substantially process-matched components with respect to each other.

Figure 4:
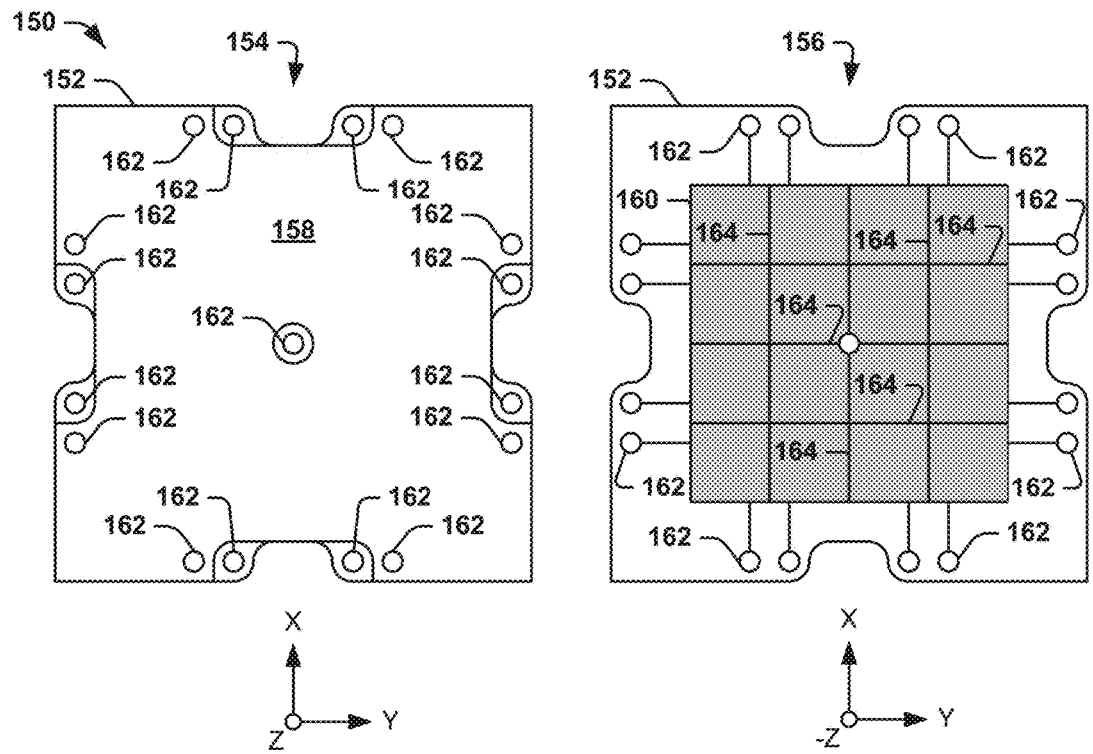
FIG. 4 illustrates an example diagram of a portion of an accelerometer sensor.

FIG. 4 illustrates an example diagram 150 of a portion of an accelerometer sensor 152. The portion of the accelerometer sensor 152 is demonstrated in a first view 154 and in a second view 156, with the first and second views 154 and 156 being in an X-Y plane and inverted with respect to each other (with respect to the Z-axis). The portion of the accelerometer sensor 152 can correspond to one of the first and second layers 102 and 104 of the accelerometer sensor 100 in the example of FIG. 3, and thus to a respective one of the etched and/or processed first or second wafer layers 52 and 54. Therefore, reference is to be made to the example of FIG. 3 in the following description of the example of FIG. 4.

The first view 154 demonstrates a top cover 158 of the portion of the accelerometer sensor 152, and the second view 156 demonstrates an electrode configuration 160 that can correspond to a respective one of the first and second electrode configurations 110 and 112. The portion of the accelerometer sensor 152 includes a plurality of electrical connections 162 to which the accelerometer controller 18 can be electrically coupled, such as to provide the control signals SIG and/or to measure the pickoff signals PO. In the example of FIG. 4, the electrical connections 162 are demonstrated on both the top cover 158 and extending through the portion of the accelerometer sensor 152. As an example, the electrical connections 162 can be solid metal conductors that extend through the portion of the accelerometer sensor 152, or can be connections directly to silicon, with the silicon being conductively coupled across multiple silicon layers (e.g., the first and second silicon layers 58 and 62). In the example of FIG. 4, the electrical connections 162 are demonstrated on multiple layers of the portion of the accelerometer sensor 152 with respect to the top cover 158, such that the electrical connections 162 can be disposed on the different multiple silicon layers (e.g., the first and second silicon layers 58 and 62). The electrical connections 162 are collectively demonstrated in a symmetrical arrangement with respect to two orthogonal mid-planes of the portion of the accelerometer sensor 152, demonstrated in the example of FIG. 4 as the X-Z plane and the Y-Z plane through the middle of the portion of the accelerometer sensor 152.

The second view 156 demonstrates the electrode configuration 160 as substantially centered with respect to the portion of the accelerometer sensor 152. As described previously, the electrode configuration 160 can correspond to a respective one of the first and second electrode configurations 110 and 112, and thus can be provided charge via the control signals SIG to provide an electrostatic force with respect to an inertial mass (e.g., the inertial mass 108). Similar to the electrical connections, the electrode configuration 160 is demonstrated in a symmetrical arrangement with respect to two orthogonal mid-planes of the portion of the accelerometer sensor 152. In addition, in the example of FIG. 4, the electrode configuration 160 is arranged with respect to the electrical connections 162 to provide for a substantially uniform distribution of electric charge on the electrode configuration as a function of time. Furthermore, in the example of FIG. 4, the electrode configuration 160 may be arranged substantially symmetrically over the inertial mass, such as the inertial mass 108 in the example of FIG. 3. The structural symmetry of the arrangement of the electrode configuration 160 with respect to the portion of the accelerometer sensor 152 and the inertial mass effectively symmetrizes thermal expansion contributions to capacitive gap distortion. Therefore, based on the symmetry and the arrangement of the electrode configuration 160 and the electrical connections 162, errors associated with a non-uniform distribution of charge can be substantially mitigated in operation of an accelerometer sensor (e.g., the accelerometer sensor 100) that includes the portion of the accelerometer sensor 152.

In addition, in the example of FIG. 4, the electrode configuration 160 is demonstrated as including a pattern of grooves 164. The pattern of grooves 164 is demonstrated as parallel grooves 164 extending in two orthogonal axes in the example of FIG. 4, but it is to be understood that the pattern of grooves 164 can be arranged in a variety of different ways (e.g., parallel grooves along a single axis). The pattern of grooves 164 can be etched in the electrode configuration 160 to provide airflow primarily out of the relatively narrow capacitive gap and into the grooves 164, and secondarily to a periphery of the electrode configuration 160 in response to displacement of the inertial mass (e.g., the inertial mass 108). This pattern of grooves 164 is provided as a means of reducing squeeze-film gas damping in the event that the associated accelerometer sensor (e.g., the accelerometer sensor 100) is gas-damped, as may be desirable in end-use applications requiring substantial acceleration dynamics. Therefore, the pattern of grooves 164 can result in a small increase in sensitive mass, as opposed to etching holes in the inertial mass as is done in a typical gas-damped accelerometer system, and can provide reduced damping for a substantially low-noise operation of the accelerometer system 100 (e.g., to lower the noise associated with Brownian motion of the inertial mass (e.g., the inertial mass 108) arising from the squeeze-film damping effects to below 4 micro-g per square root Hz). Thus, the pattern of grooves 164 can substantially improve the operation of the accelerometer system 100.

Figure 5:
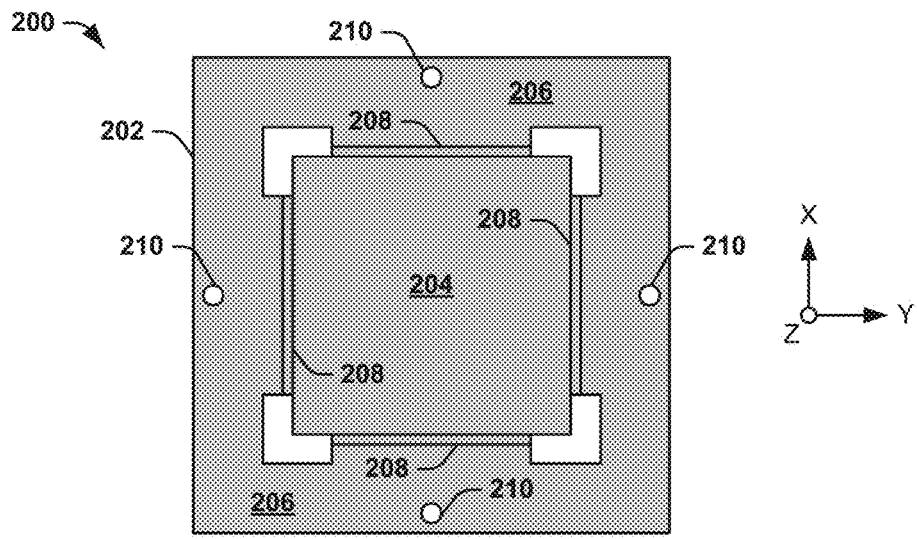
FIG. 5 illustrates another example diagram of a portion of an accelerometer sensor.

FIG. 5 illustrates another example diagram 200 of a portion of an accelerometer sensor 202. The portion of the accelerometer sensor 202 can correspond to the third layer 106 of the accelerometer sensor 100 that includes the inertial mass 108 in the example of FIG. 3, and thus to the respective etched and/or processed third wafer layer 56. The portion of the accelerometer sensor 202 is demonstrated in the X-Y plane, and can form a complete accelerometer sensor (e.g., the accelerometer sensor 100) along with two of the portions of the accelerometer sensor 152 in the example of FIG. 4 (e.g., above and below the portion of the accelerometer sensor 202 with respect to the Z-axis). Therefore, reference is to be made to the examples of FIGS. 3 and 4 in the following description of the example of FIG. 5.

The portion of the accelerometer sensor 202 includes an inertial mass 204 that is coupled to a frame 206 via flexures 208. The frame 206 can be coupled to respective portions of the accelerometer sensor 152 above and below the portion of the accelerometer sensor 202 (via the Z-axis), such as based on etching away respective interconnecting silicon-dioxide layers, such as via the adjoining silicon-dioxide layers 64 and 76 and the adjoining silicon-dioxide layers 72 and 78 in the example of FIG. 2. The flexures 208 are configured in the example of FIG. 5 as a set of flexures that are arranged at each peripheral surface of the inertial mass 204 in a symmetric manner about two orthogonal mid-planes. Therefore, motion of the inertial mass 204 up and down along an input axis (e.g., the input axis 118) that is orthogonal to the plane of the inertial mass 204 can be maintained in a substantially planar motion with respect to the frame 206, such that an angle between the inertial mass 204 relative to the first and second electrode configurations (e.g., the electrode configurations 160 above and below the inertial mass 204 along the Z-axis), which is nominally zero, can remain substantially constant to substantially avoid some of the disadvantages of pendulous motion, such as wedge-effects, that can affect the scale-factor and/or bias of the accelerometer sensor. As an example, based on the etching and/or fabrication processing of the first, second, and third layers 102, 104, and 106 (e.g., from the respective wafer layers 52, 54, and 56), the inertial mass 204 and the electrode configurations 160 can be fabricated as substantially process-matched components with respect to each other.

The portion of the accelerometer sensor 202 also includes a plurality of electrical connections 210 to which the accelerometer controller 18 can be electrically coupled, such as a low-voltage rail (e.g., ground) connection. In the example of FIG. 5, the electrical connections 210 can be present on both sides of the portion of the accelerometer sensor 202, such as extending through the portion of the accelerometer sensor 202. As an example, the electrical connections 210 can be solid metal conductors that extend through the portion of the accelerometer sensor 202, or can be connections directly to silicon. The inertial mass 204, the frame 206, the flexures 208, and the electrical connections 210 are collectively demonstrated in a symmetrical arrangement with respect to two orthogonal mid-planes of the portion of the accelerometer sensor 202, demonstrated in the example of FIG. 5 as the X-Z plane and the Y-Z plane through the middle of the portion of the accelerometer sensor 202. Therefore, combined with the respective portions of the accelerometer sensor 152 above and below the portion of the accelerometer sensor 202 (via the Z-axis), the resulting accelerometer sensor (e.g., the accelerometer sensor 100) can have a completely symmetrical arrangement with respect to all three orthogonal mid-planes (X-Y plane, X-Z-plane, and Y-Z plane).

With reference to the examples of FIGS. 3-5, based on the symmetric arrangement of the accelerometer sensor 100, a variety of errors in the calculation of the acceleration can be substantially mitigated. For example, first order bias effects of chip self-distortion, such as due to a thermal expansion coefficient mismatch between silicon, silicon-dioxide, silicon-nitride, and/or any other materials of the accelerometer sensor 100, can be substantially mitigated. As another example, the symmetry of the accelerometer sensor 100 can balance the thickness in various layers (e.g., the sub-layers of the layers 102, 104, and 106) of the IC chip to minimize self-distortion temperature sensitivity. As another example, the symmetry of the accelerometer sensor 100 can reduce stiffness of the electrode configurations 110 and 112 relative to the frame 114, and thus can further reduce driving forces behind temperature-sensitive self-distortion of the accelerometer sensor 100. As another example, the symmetry of the accelerometer sensor 100 can minimize the etched-out area of the electrode configurations 110 and 112 relative to the frame 114, such as to maximize the overall stiffness of the frame 114 and thereby minimize the sensitivity to self-distortion stress (e.g., including thermal gradients) and applied stresses.

As yet another example, the symmetry of the accelerometer sensor 100 can increase a ratio of sensitive capacitance to stray capacitance (e.g., the ratio of inertial mass-to-electrode capacitance to inertial-mass-to-ground capacitance) by increasing the inertial-mass-to-electrode area as compared to the inertial-mass-to-ground area. Such an arrangement also provides the option of including approximately one micron of thermally-grown silicon-dioxide (e.g., the adjoining silicon-dioxide layers 64 and 76 and the adjoining silicon-dioxide layers 72 and 78) in the inertial-mass-to-electrode gap to further increase the capacitance from the inertial mass 108 to the electrode configurations 110 and 112 without modification of the capacitance from the inertial mass 108 to ground. As a result, the effects of ground-plane noise on the measurement of displacement of the inertial mass 108 can be mitigated, resulting in decreased noise in the measured acceleration ACC. The oxide on the inertial mass 108 can have an additional effect of reducing a voltage required to actuate the inertial mass 108 at a given full-scale range. Accordingly, the arrangement of the accelerometer sensor 100, as demonstrated in the examples of FIGS. 3-5, can provide for substantially mitigated errors in the measurement of the acceleration ACC.

It is to be understood that the physical arrangement of the accelerometer sensor 100, as demonstrated in FIGS. 3-5, is provided as an example. A variety of other types of arrangements to provide symmetry of the accelerometer sensor 100 about the three orthogonal mid-planes can be implemented instead of the examples of FIGS. 3-5 to provide the implementation of measurement of the acceleration ACC with substantially mitigated errors.

Figure 6:
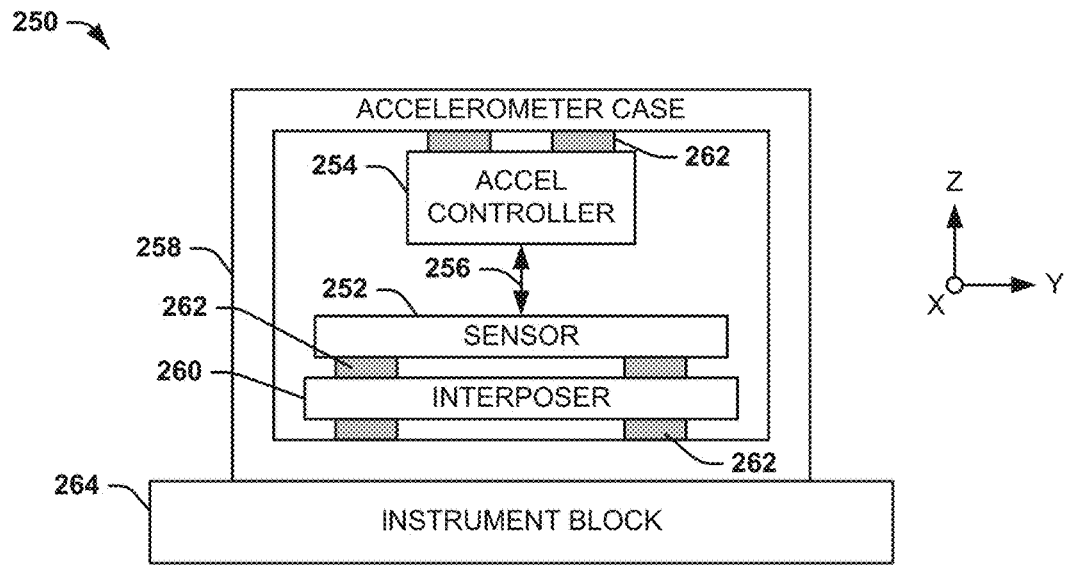
FIG. 6 illustrates another example of an accelerometer system.

FIG. 6 illustrates another example of an accelerometer system 250. The accelerometer system 250 can correspond to the accelerometer system 10 in the example of FIG. 1, but demonstrates an example of details as to the physical mounting arrangement of the accelerometer system 250. Thus, reference is to be made to the examples of FIGS. 1-5 in the following description of the example of FIG. 6. The accelerometer system 250 is demonstrated in a cross-sectional view in the same coordinate system as demonstrated in the examples of FIGS. 2-5.

The accelerometer system 250 includes an accelerometer sensor 252. In the example of FIG. 6, the accelerometer sensor 252 is configured as an IC chip, such as arranged as demonstrated in the examples of FIGS. 3-5. Therefore, the accelerometer sensor 252 includes an inertial mass and electrode configurations between which the inertial mass is disposed. The accelerometer system 250 also includes an accelerometer controller 254 corresponding to the electronics system of the accelerometer system 250, such as configured substantially similar to the accelerometer controller 18 in the example of FIG. 1. The accelerometer controller 254 can thus include a signal generator, a measurement system, and an acceleration processor. In the example of FIG. 6, the accelerometer controller 254 is electrically coupled with the accelerometer sensor 252, demonstrated by a bi-directional arrow 256, such as to provide control signals SIG and to measure corresponding pickoff signals PO associated with a capacitance of the electrode configurations of the accelerometer sensor 252 relative to the inertial mass. Therefore, the acceleration controller 254 can be configured to calculate the input acceleration ACC of the accelerometer system 250 in response to a force acting upon the inertial mass of the accelerometer sensor 252 based on the force rebalance of the inertial mass to a null position.

The accelerometer sensor 252 and the accelerometer controller 254 are arranged as being at least partially enclosed within an accelerometer case 258. As an example, the accelerometer case 258 can be an at least partial enclosure in which the accelerometer system 10 in the example of FIG. 1 is arranged and enclosed. In the example of FIG. 6, the accelerometer sensor 252 is mounted to a mounting interposer 260, which is mounted to an interior surface of the accelerometer case 258. In the example of FIG. 6, the mounting interposer 260 is mounted to the accelerometer case 258 via a mechanically compliant adhesive 262, and the accelerometer sensor 252 is likewise mounted to the mounting interposer 260 via the mechanically compliant adhesive 262. As an example, the mounting of the mounting interposer 260 can be symmetric with respect to two orthogonal mid-planes of the surface of the accelerometer case 258 and the mounting of the accelerometer sensor 252 can be symmetric with respect to two orthogonal mid-planes of the mounting interposer 260. Additionally, the mechanically compliant adhesive 262 can be arranged in an adhesive pattern that is symmetric with respect to two orthogonal mid-planes of the surface of the accelerometer case 258 and the mounting interposer 260, respectively.

Figure 7:
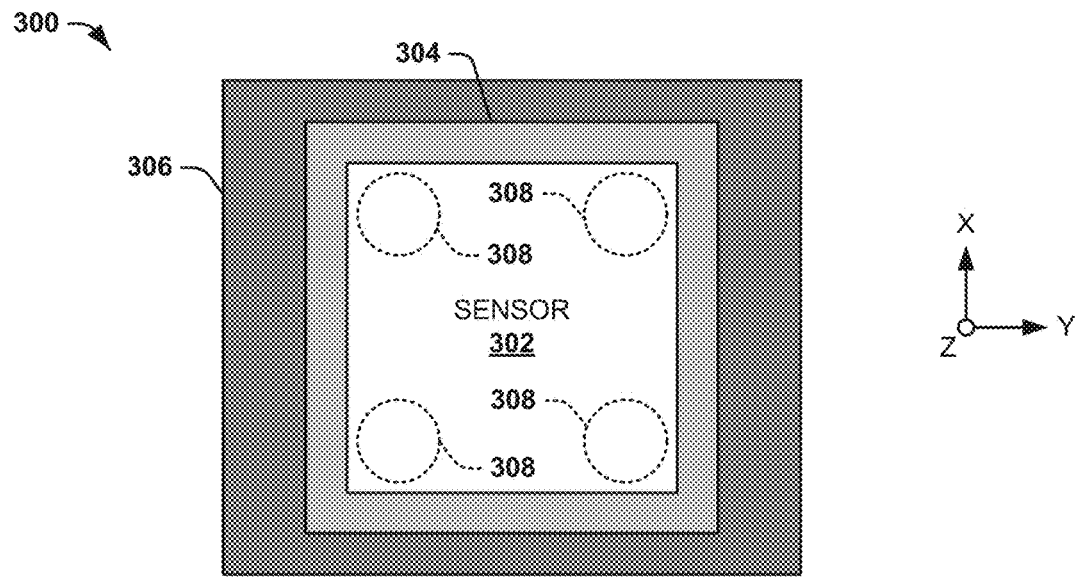
FIG. 7 illustrates an example diagram of an accelerometer sensor mounting system.

FIG. 7 illustrates an example diagram 300 of an accelerometer sensor mounting system. The diagram 300 demonstrates an accelerometer sensor 302, a mounting interposer 304, and a surface of an accelerometer case 306 in an overhead view (e.g., along the Z-axis). As an example, the accelerometer sensor 302, the mounting interposer 304, and the surface of the accelerometer case 306 can correspond to the accelerometer sensor 252, the mounting interposer 260, and the accelerometer case 258 in the example of FIG. 6, respectively. Therefore, reference is to be made to the example of FIG. 6 in the following description of the example of FIG. 7.

In the example of FIG. 7, the accelerometer sensor 302 is mounted over the mounting interposer 304, which is mounted over the surface of the accelerometer case 306. In the example of FIG. 7, the mounting of the accelerometer sensor 302 is demonstrated as symmetric with respect to two orthogonal mid-planes of the mounting interposer 304 (the X-Z plane and the Y-Z plane). Similarly, the mounting of the mounting interposer 304 is demonstrated as symmetric with respect to two orthogonal mid-planes of the surface of the accelerometer case 306 (the X-Z plane and the Y-Z plane). Additionally, the diagram 300 demonstrates an adhesive pattern of a mechanically compliant adhesive, demonstrated as dotted circles 308, that bond the accelerometer sensor 302 to the mounting interposer 304. As an example, the mechanically compliant adhesive 308 can be applied in a thickness controlled manner, and can have a cure temperature that is only slightly greater than a maximum operating temperature of the associated accelerometer system (e.g., the accelerometer system 250). The adhesive pattern of the mechanically compliant adhesive 308 is demonstrated as arranged in a manner that is symmetric with respect to two orthogonal mid-planes of the mounting interposer 304 (the X-Z plane and the Y-Z plane). An additional layer of mechanically compliant adhesive can likewise bond the mounting interposer 304 to the surface of the accelerometer case 306, such as in a similar adhesive pattern. While the mechanically compliant adhesive 308 is demonstrated in an adhesive pattern of four "dots", it is to be understood that a variety of other adhesive patterns that are symmetric about two orthogonal mid-planes can instead be implemented.

Based on the implementation of the symmetric mounting of the accelerometer sensor 302 to the mounting interposer 304, the symmetric mounting of the mounting interposer 304 to the surface of the accelerometer case 306, and the symmetry of the adhesive pattern of the mechanically compliant adhesive 308, a number of errors in the calculation of the external acceleration ACC (e.g., via the accelerometer controller 254 in the example of FIG. 6) can be substantially mitigated. As an example, the arrangement of the accelerometer sensor mounting system in the example of FIG. 7 can reduce a stress at a given temperature within the operational range of the accelerometer system 250, and can substantially mitigate (e.g., to first order) being subjected to temperature sensitivity of mounting alignment, such as can be induced by an asymmetric mounting scheme. In addition, mechanical stress transferred to the mounting interposer 304 via the surface of the accelerometer case 306 due to thermal expansion mismatches between the respective mounting interposer 304 and the surface of the accelerometer case 306 can be substantially mitigated. Similarly, mechanical stress transferred to the accelerometer senso 302 via the mounting interposer 304 due to thermal expansion mismatches between the respective accelerometer sensor 302 and the mounting interposer 304 can likewise be substantially mitigated.

Referring back to the example of FIG. 6, the accelerometer controller 254 is demonstrated as being mounted to an interior surface of the accelerometer case 258 via the mechanically compliant adhesive 262. As an example, the mechanically compliant adhesive 262 can be arranged in an adhesive pattern similar to as demonstrated in the example of FIG. 7. Therefore, the effects of a thermal expansion mismatch between the electronics of the accelerometer controller 254 and the accelerometer case 258 can be substantially mitigated, such as similar to as described previously in the example of FIG. 7, to provide substantially mitigated deleterious effects on calculation of the acceleration ACC with respect to bias and/or scale factor errors. Additionally, the accelerometer case 258 is demonstrated as being mounted to an instrument block 264 that can correspond to a navigation and/or avionics system (e.g., including additional accelerometer systems, magnetometer systems, and/or gyroscope systems), such as mounted on an interior surface of a fuselage or vehicle frame.

As an example, the mounting interposer 260 can be fabricated from a material that is non-conductive, and can exhibit thermal expansion characteristics that are substantially equal to thermal expansions characteristics of the accelerometer sensor 252. For example, the mounting interposer 260 can be fabricated from a silica material. As another example, the accelerometer case 258 can be formed from the same material as the instrument block 264, or from a material that exhibits thermal expansion characteristics that are substantially equal to thermal expansions characteristics of the instrument block 264. Based on the substantial thermal expansion-matching characteristics of the mounting interposer 260 and the accelerometer sensor 252, and the accelerometer case 258 and the instrument block 264, respectively, errors in the calculation of the acceleration ACC can be substantially mitigated. For example, the substantial thermal expansion-matching characteristics of the mounting interposer 260 and the accelerometer sensor 252 can result in a substantial reduction in temperature-sensitive force applied to the inertial mass (e.g., the inertial mass 108) at a given temperature. As another example, the substantial thermal expansion-matching characteristics of the accelerometer case 258 and the instrument block 264 can substantially mitigate (e.g., to first order) distortion of the accelerometer case 258 over temperature, such as can result from a thermal expansion mismatch between the accelerometer case 258 and the instrument block 264. Thus, non-uniform charge distribution, such as resulting from mechanical distortion of the accelerometer sensor 252 resulting from thermal expansion mismatches in the materials of the accelerometer system 250, and other associated errors (e.g., bias and scale-factor) can be substantially mitigated for a more accurate calculation of the acceleration ACC.

Figure 8:
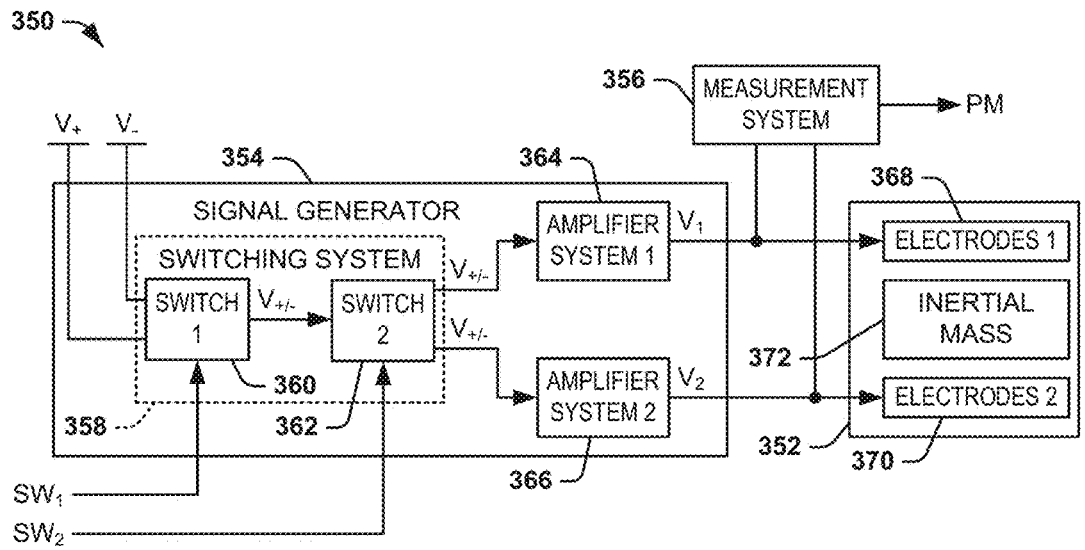
FIG. 8 illustrates yet another example of an accelerometer system.

FIG. 8 illustrates yet another example of an accelerometer system 350. The accelerometer system 350 can correspond to portions of the accelerometer system 10 in the example of FIG. 1. The accelerometer system 350 includes an accelerometer sensor 352 that can correspond to the accelerometer sensor 100 in the example of FIG. 3 (e.g., and the examples of FIGS. 4 and 5, by extension). The accelerometer system 350 also includes a signal generator 354 and a measurement system 356, which can correspond, respectively, to the signal generator 20 and the measurement system 22 in the accelerometer controller 18 in the example of FIG. 1. Therefore, reference is to be made to the example of FIG. 1 in the following description of the example of FIG. 8.

The signal generator 354 includes a switching system 358 that includes a first switch 360 and a second switch 362. As described herein, the first and second switches 360 and 362 can be configured as physical switches, transistor switches, separate outputs from a processor, or the same output from a processor that provides a varying voltage, and is thus not limited to an actual physical switch, but is merely demonstrated conceptually in the example of FIG. 8. The first switch 360 is configured to provide one of a positive voltage $V_+$ and a negative voltage $V_-$ as a voltage $V_{+/-}$ in response to a first switching signal $SW_1$. As an example, the positive and negative voltages $V_+$ and $V_-$ can be voltages that can have approximately equal and opposite amplitudes with respect to a zero voltage amplitude. For example, the positive and negative voltages $V_+$ and $V_-$ can be generated via one or two respective power supplies. The second switch 362 is configured to provide the voltage $V_{+/-}$ to one of a first charge amplifier system 364 and a second charge amplifier system 366 in response to a second switching signal $SW_2$. The first charge amplifier system 364 is configured to provide a voltage $V_1$ to a first electrode configuration 368 associated with the accelerometer sensor 352, and the second charge amplifier system 366 is configured to provide a voltage $V_2$ to a second electrode configuration 370 associated with the accelerometer sensor 352. As an example, the first and second charge amplifier systems 364 and 366 can be configured approximately the same with respect to each other.

As an example, the voltages $V_1$ and $V_2$ can correspond to the control signals SIG in the example of FIG. 1. For example, the voltages $V_1$ and $V_2$ can thus correspond to charge pulses (e.g., current pulses) of a substantially equal and opposite amplitude (e.g., based on the voltages $V_+$ and $V_-$) that are provided to the electrode configurations 368 and 370 in a predetermined alternating sequence based on the switching signals $SW_1$ and $SW_2$ to generate electrostatic forces to accelerate an inertial mass 372 (e.g., corresponding to the inertial mass 100) toward a respective null position (e.g., to rebalance the inertial mass 372). As an example, during a first measurement cycle (e.g., based on the first switching signal $SW_1$), the voltage $V_{+/-}$ can correspond to the positive voltage $V_+$ that is amplified via the first charge amplifier system 364 as the voltage $V_1$ and provided to first electrode configuration 368 first, followed by the positive voltage $V_+$ being amplified via the second charge amplifier system 366 as the voltage $V_2$ and provided to second electrode configuration 370 (e.g., based on the second switching signal $SW_2$). Thus, during a second measurement cycle (e.g., based on the first switching signal $SW_1$), the voltage $V_{+/-}$ can correspond to the negative voltage $V_-$ that is amplified via the first charge amplifier system 364 as the voltage $V_1$ and provided to first electrode configuration 368 first, followed by the negative voltage $V_-$ being amplified via the second charge amplifier system 366 as the voltage $V_2$ and provided to second electrode configuration 370 (e.g., based on the second switching signal $SW_2$).

As a result, the inertial mass 372 is alternately accelerated in the first and second directions in each of the first and second measurement cycles to position the inertial mass 372 toward the null position at each charge pulse application. In response to an external force, an acceleration processor (e.g., the acceleration processor 24) can be configured to adjust the second switching signal $SW_2$ to change a duty-cycle of the charge pulses, such as to change a pulse-width of the charge pulses, to apply a greater rebalance force to one side of the respective inertial mass 372. As a result of a capacitive coupling between the respective electrode configurations 368 and 370 and the inertial mass 372, the measurement system 356 can be configured to measure the respective voltages $V_1$ and $V_2$ as pickoff signals PO corresponding to an indication of the relative displacement of the inertial mass 372. The amplitudes of the voltages $V_1$ and $V_2$ can thus be proportional to a displacement (e.g., capacitive gap) of the inertial mass 372 relative to the respective electrode configurations 368 and 370. Accordingly, the amplitude of the voltages $V_1$ and $V_2$ can correspond to a magnitude of the relative displacement of the inertial mass 372. The measurement system 356 can thus be configured to generate the signal PM that corresponds to the displacement of the inertial mass 372 and/or a time integral of the displacement of the inertial mass 372 based on the voltages $V_1$ and $V_2$, such as resulting from an external acceleration. The acceleration processor 24 can thus be configured to calculate the magnitude of the external acceleration ACC based on the signal PM.

Figure 9:
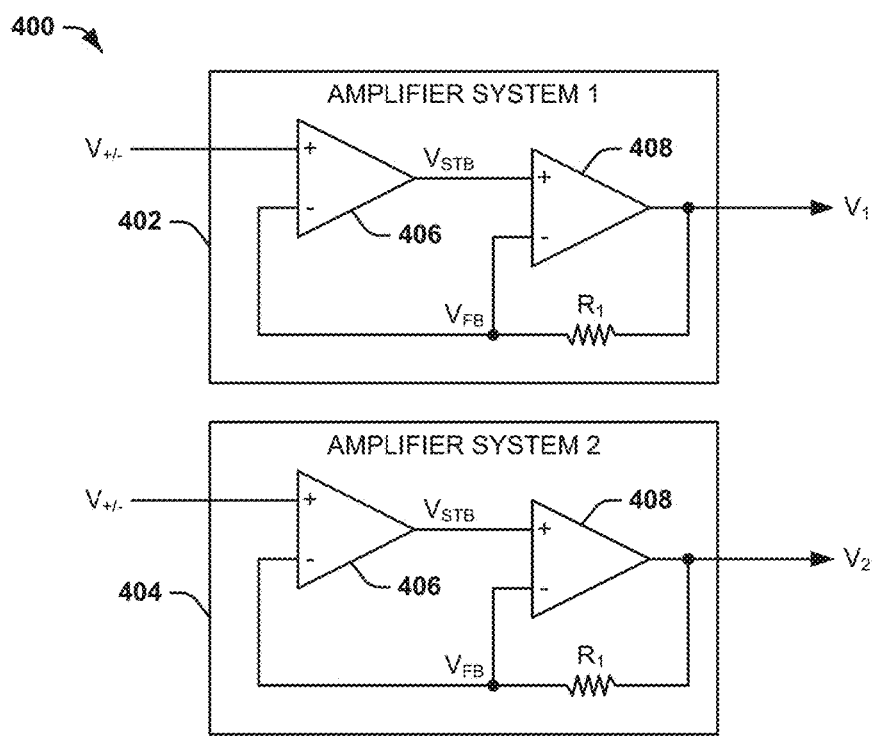
FIG. 9 illustrates an example of a portion of a signal generator system.

FIG. 9 illustrates an example of a portion of a signal generator system 400. The portion of the signal generator system 400 can correspond to a portion of the signal generator system 354 in the example of FIG. 8. In the example of FIG. 9, the portion of the signal generator system 400 includes a first charge amplifier system 402 and a second charge amplifier system 404, which can correspond respectively to the first and second charge amplifier systems 364 and 366 in the example of FIG. 8. Therefore, reference is to be made to the example of FIG. 8 in the following description of the example of FIG. 9.

The first and second charge amplifier systems 402 and 404 are configured substantially the same with respect to each other. Each of the first and second charge amplifier systems 402 and 404 includes a first amplifier 406 and a second amplifier 408 that are configured in a cascaded arrangement. The first amplifier 406 includes a non-inverting input that receives the voltage $V_{+/-}$ and an inverting input that receives a feedback voltage $V_{FB}$. The feedback voltage $V_{FB}$ is associated with the respective output voltage of the first and second charge amplifier systems 402 and 404, and thus the respective voltages $V_1$ and $V_2$ provided through a respective resistor $R_1$ that is associated with each of the first and second charge amplifier systems 402 and 404. The first amplifier 406 provides a voltage $V_{STB}$ at an output in response to the voltages $V_{+/-}$ and $V_{FB}$. The voltage $V_{STB}$ is provided to a non-inverting input of the second amplifier 408. The second amplifier $V_{STB}$ also receives the feedback voltage $V_{FB}$ at an inverting input. Thus, the second amplifier 408 provides the respective one of the voltages $V_1$ and $V_2$ based on the voltage $V_{STB}$ and the feedback voltage $V_{FB}$.

The first and second amplifiers 406 and 408 can be configured as amplifiers that exhibit different behavioral characteristics. As an example, the first amplifier 406 can be configured as a high-stability amplifier, such that the voltage $V_{STB}$ can exhibit high stability characteristics in response to the voltage $V_{STB}$ and the feedback voltage $V_{FB}$. As another example, the second amplifier 408 can be configured as a high bandwidth and high slew-rate amplifier, such that the second amplifier 408 can exhibit rapid changes and a high dynamic range in the respective voltage $V_1$ or $V_2$ based on the voltage $V_{STB}$ and the feedback voltage $V_{FB}$. As a result, the first and second amplifiers 406 and 408 can collectively achieve characteristics that are typically competing in an individual amplifier. Accordingly, the first and second charge amplifier systems 402 and 404 can provide stable voltages $V_1$ and $V_2$ (e.g., with a reduced settling time), respectively, that can change rapidly in amplitude and polarity in response to rapid switching between the positive voltage $V_+$ and the negative voltage $V_-$. As a result, the displacement of the inertial mass 372 relative to a null position, and thus the acceleration ACC, can be calculated in a manner that substantially mitigates noise resulting from a lack of stability of the control signals SIG that apply charge.

Referring back to the example of FIG. 8, based on the collective characteristics of high stability, high bandwidth, and high slew-rate of the first and second charge amplifier systems 364 and 366 in generating the respective voltages $V_1$ and $V_2$, the switching system 358 can be implemented at the inputs of the respective first and second charge amplifier systems 364 and 366, as opposed to signal generators that implement a single charge amplifier system that is switched between the sets of electrodes at a respective output. For example, by implementing the switching system 358 at the inputs of the respective first and second charge amplifier systems 364 and 366, a parasitic capacitance that can be exhibited in parallel with an inertial mass-to-electrode capacitance can be substantially mitigated. In addition, based on an inherent resistance in switches, the voltages $V_1$ and $V_2$ can be provided at a substantially reduced amplitude relative to the voltage provided by the charge amplifier in a typical signal generator based on the resistance of the switch at the output of the charge amplifier in the typical signal generator. As a result, a contribution to displacement sensitivity resulting from any stray capacitance can be substantially reduced. Thus, the signal generator 354 can implement a low charge injection via the voltages $V_1$ and $V_2$, which can allow incorporation of the signal generator 354 into an application-specific integrated circuit (ASIC).

Figure 10:
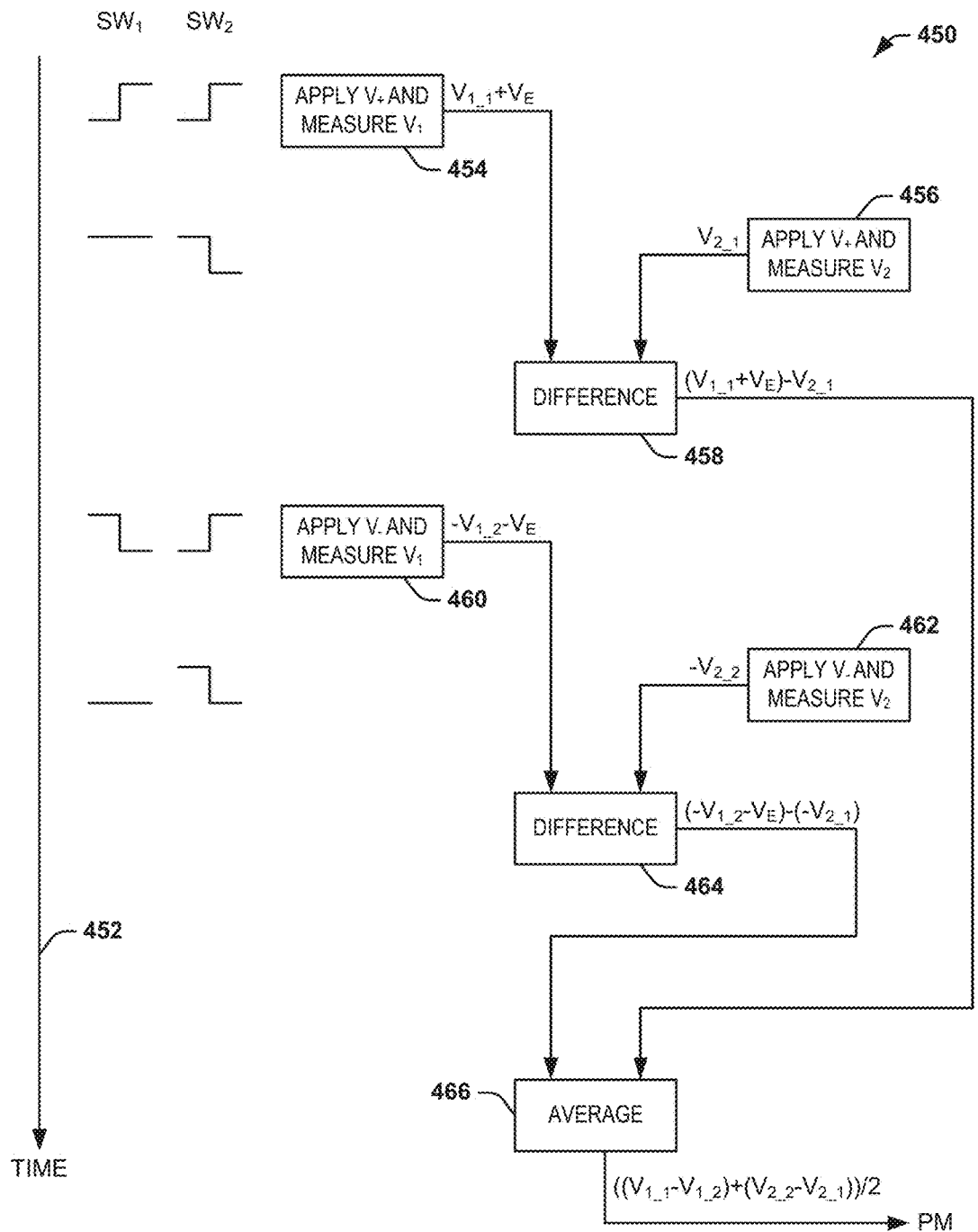
FIG. 10 illustrates an example of an algorithm for mitigating errors in an accelerometer system.

As described previously, the switching system 358 can sequentially provide the respective positive and negative voltages $V_+$ and $V_-$ to the first and second charge amplifier systems 364 and 366 for sequential application of charge to the respective electrode configurations 368 and 370 via the voltages $V_1$ and $V_2$. FIG. 10 illustrates an example diagram 450 of an algorithm for mitigating errors in an accelerometer system. The algorithm can be implemented by the acceleration processor 24 in the example of FIG. 1 to calculate the acceleration ACC in a manner that substantially mitigates errors, such as resulting from low-frequency and/or DC noise and drift in the electronics and/or in the electrical charge at the silicon to silicon-dioxide interface of the accelerometer sensor (e.g., the accelerometer sensor 100). The algorithm demonstrated in the example of FIG. 10 can be implemented by the acceleration processor 24 based on the switching signals $SW_1$ and $SW_2$ and monitoring the pickoff signals PO corresponding to the voltages $V_1$ and $V_2$ via the signal PM in the example of FIG. 8. Therefore, reference is to be made to the example of FIG. 8 in the following description of the example of FIG. 10. In the example of FIG. 10, the steps of the algorithm are implemented in chronological order beginning from the top and proceeding down, as demonstrated by the arrow 452 indicating time. It is to be understood that the time-scale may not be to scale.

In response to a rising-edge of the first switching signal $SW_1$, the positive voltage $V_+$ is provided as the voltage $V_{+/-}$ via the first switch 360 during a first measurement cycle (e.g., as defined by the first switching signal $SW_1$). Additionally, in response to a rising-edge of the second switching signal $SW_2$, the voltage $V_{+/-}$ is provided to the input of the first charge amplifier system 364 via the second switch 362. Thus, at a logic-high state of both of the first and second switching signals $SW_1$ and $SW_2$, the positive voltage $V_+$ is provided to the input of the of the first charge amplifier system 364 via the switching system 358. At 454, a charge associated with the positive voltage $V_+$ is provided to the first electrode configuration 368, and the voltage $V_1$ is measured by the measurement system 356. In the example of FIG. 10, the pickoff voltage that is measured by the measurement system 356 associated with the capacitive gap between the first electrode configuration 368 and the inertial mass 372 can include an error voltage $V_E$, such as resulting from charge drift in the electronics and/or the accelerometer sensor 352. The error voltage $V_E$ can thus be exhibited at the output of the first charge amplifier system 364, and is thus demonstrated as a pickoff voltage "$V_{1\_1}+V_E$" corresponding to the voltage $V_1$ plus the error voltage $V_E$ during the first measurement cycle. Accordingly, the measurement system 356 can measure the pickoff voltage $V_{1\_1}+V_E$ at 454.

As described previously, during a logic-high state of the first switching signal $SW_1$, and thus during the first measurement cycle, the positive voltage $V_+$ is provided as the voltage $V_{+/-}$ via the first switch 360. In response to a falling-edge of the second switching signal $SW_2$, the voltage $V_{+/-}$ is provided to the input of the second charge amplifier system 366 via the second switch 362. Thus, the positive voltage $V_+$ is provided to the input of the of the second charge amplifier system 366 via the switching system 358. At 456, a charge associated with the positive voltage $V_+$ is provided to the second electrode configuration 370, and the voltage $V_2$ is measured by the measurement system 356. In the example of FIG. 10, since the error voltage $V_E$ may not be uniform with respect to both the first and second electrode configurations 368 and 370, the error voltage $V_E$ is demonstrated as not acting upon the second electrode configuration 370. Thus, the pickoff voltage that is measured by the measurement system 356 associated with the capacitive gap between the second electrode configuration 370 and the inertial mass 372 is demonstrated as a pickoff voltage "$V_{2\_1}$" corresponding to the voltage $V_2$ during the first measurement cycle. Accordingly, the measurement system 356 can measure the pickoff voltage $V_{2\_1}$ at 456. Despite the absence of the error voltage $V_E$ in the measurement of the pickoff voltage $V_{2\_1}$, it is to be understood that the error voltage $V_E$ could be exhibited in the pickoff voltage $V_{2\_1}$ instead of the pickoff voltage $V_{1\_1}+V_E$, and that both pickoff voltages could include equal or different error voltages.

At 458, the acceleration processor 24 can be configured to calculate a difference in the pickoff voltages $V_{1\_1}+V_E$ and $V_{2\_1}$, resulting in a first voltage difference term of "$(V_{1\_1}+V_E)-V_{2\_1}$". The first voltage difference term $(V_{1\_1}+V_E)-V_{2\_1}$ can thus correspond to a relative displacement of the inertial mass 372 relative to the electrical null position during the first measurement cycle. Ideally, if the first voltage difference term $(V_{1\_1}+V_E)-V_{2\_1}$ is equal to zero, then the acceleration processor 24 would identify that the inertial mass 372 is at the electrical null. However, because of the error voltage $V_E$, the acceleration processor 24 can be unable to accurately identify the relative displacement of the inertial mass 372, and could be attempting to force-rebalance the inertial mass 372 via subsequent application of charge (e.g., via the voltages $V_1$ and $V_2$) to a location that is offset from the electrical null based on the error voltage $V_E$.

In response to a falling-edge of the first switching signal $SW_1$, the negative voltage $V_-$ is provided as the voltage $V_{+/-}$ via the first switch 360 during a second measurement cycle. Additionally, in response to a rising-edge of the second switching signal $SW_2$, the voltage $V_{+/-}$ is provided to the input of the first charge amplifier system 364 via the second switch 362. Thus, at a logic-low state of the first switching signal $SW_1$ and a logic-high state of the second switching signal $SW_2$, the negative voltage $V_-$ is provided to the input of the of the first charge amplifier system 364 via the switching system 358. At 460, a charge associated with the negative voltage $V_-$ is provided to the first electrode configuration 368, and the voltage $V_1$ is measured by the measurement system 356. As described previously, the diagram 400 demonstrates the error voltage $V_E$ being associated with the first electrode configuration 368. Therefore, the error voltage $V_E$ can be exhibited at the output of the first charge amplifier system 364, and is thus demonstrated as a pickoff voltage "$-V_{1\_2}-V_E$" corresponding to the voltage $V_1$ minus the error voltage $V_E$ (due to the change of polarity of the voltage $V_1$) during the second measurement cycle. Accordingly, the measurement system 356 can measure the pickoff voltage $-V_{1\_2}-V_E$ at 460.

As described previously, during a logic-low state of the first switching signal $SW_1$, and thus during the second measurement cycle, the negative voltage $V_-$ is provided as the voltage $V_{+/-}$ via the first switch 360. In response to a falling-edge of the second switching signal $SW_2$, the voltage $V_{+/-}$ is provided to the input of the second charge amplifier system 366 via the second switch 362. Thus, the negative voltage $V_-$ is provided to the input of the of the second charge amplifier system 366 via the switching system 358. At 462, a charge associated with the negative voltage $V_-$ is provided to the second electrode configuration 370, and the voltage $V_2$ is measured by the measurement system 356. As described previously, the error voltage $V_E$ is not exhibited in the second electrode configuration 370 in the example of FIG. 10. Thus, the pickoff voltage that is measured by the measurement system 356 associated with the capacitive gap between the second electrode configuration 370 and the inertial mass 372 is demonstrated as a pickoff voltage "$-V_{2\_2}$" corresponding to the voltage $V_2$ during the second measurement cycle. Accordingly, the measurement system 356 can measure the pickoff voltage $V_{2\_2}$ at 462.

At 464, the acceleration processor 24 can be configured to calculate a difference in the pickoff voltages $-V_{1\_2}-V_E$ and $-V_{2\_1}$, resulting in a second voltage difference term of "$(-V_{1\_2}-V_E)-(-V_{2\_1})$". The second voltage difference term $(-V_{1\_2}-V_E)-(-V_{2\_1})$ can thus correspond to a relative displacement of the inertial mass 372 relative to the electrical null position during the second measurement cycle. At 466, the acceleration processor 24 can be configured to calculate an average of the first and second voltage difference terms, thus resulting in an average term "$((V_{1\_1}-V_{1\_2})+(V_{2\_2}-V_{2\_1}))/2$". Based on averaging the first voltage difference term $(V_{1\_1}+V_E)-V_{2\_1}$, associated with the sequential application of the voltages $V_1$ and $V_2$ to the first and second electrode configurations 368 and 370 based on the positive voltage $V_+$, and the second voltage difference term $(-V_{1\_2}-V_E)-(-V_{2\_1})$, associated with the sequential application of the voltages $V_1$ and $V_2$ to the first and second electrode configurations 368 and 370 based on the negative voltage $V_-$, the error voltage $V_E$ is mathematically canceled. The average term $((V_{1\_1}-V_{1\_2})-(V_{2\_2}-V_{2\_1}))/2$ can thus be provided as the signal PM corresponding to the displacement of the inertial mass 372. Accordingly, the algorithm demonstrated in the diagram 400, as performed by the acceleration processor 24, can act as a high-pass filter with respect to the pickoff voltages in the first and second measurement cycles to substantially mitigate low-frequency noise resulting from noise and/or charge drift in the electronics and/or the accelerometer sensor 352. The acceleration processor 24 can thus control the duty-cycle of the switching signals $SW_1$ and $SW_2$ to control the force rebalance of the inertial mass 372 in a feedback manner to calculate the acceleration ACC in a manner that is substantially absent the low-frequency error sources.

Figure 11:
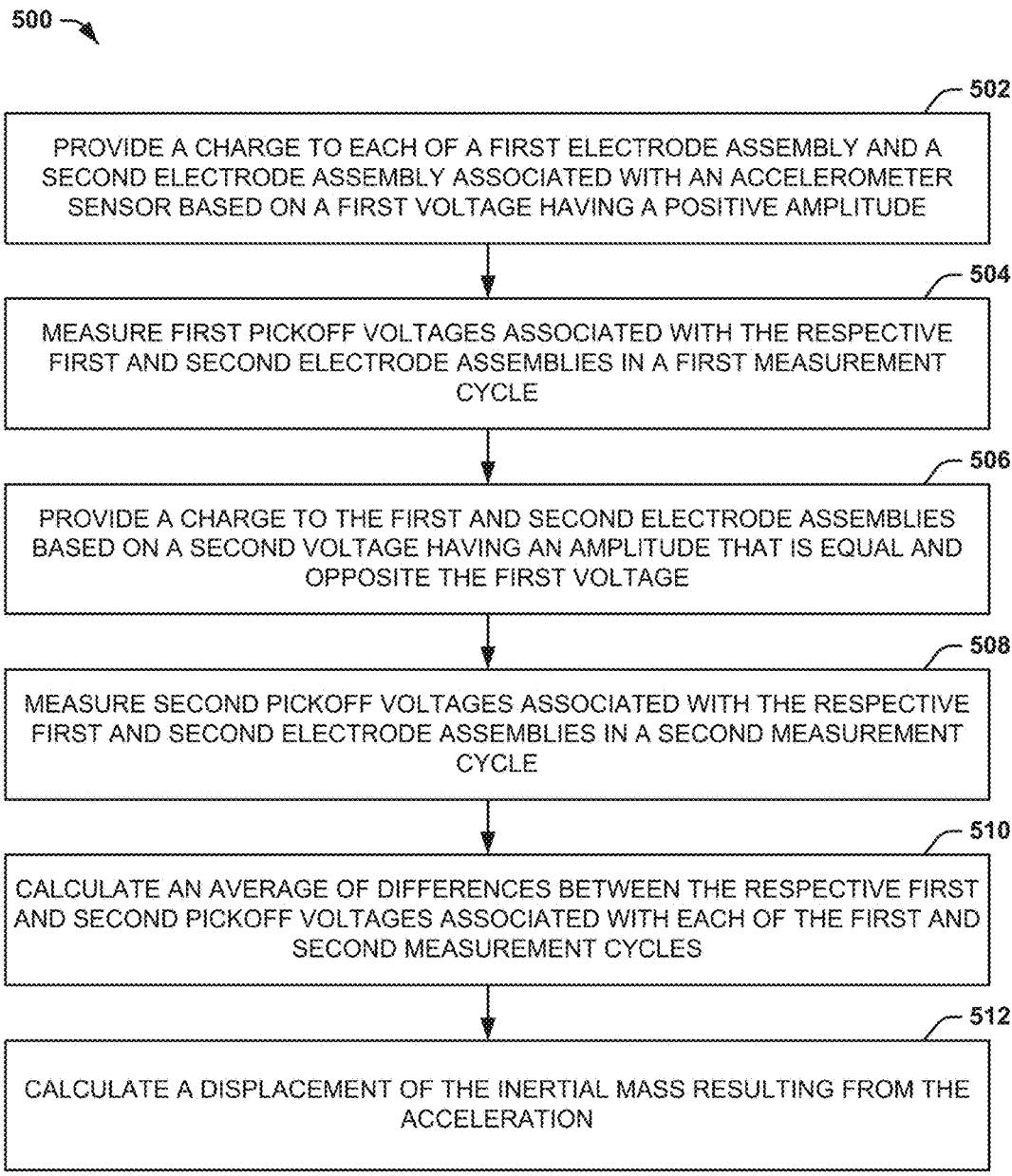
FIG. 11 illustrates an example of a method for calculating an acceleration.

In view of the foregoing structural and functional features described above, a methodology in accordance with various aspects of the present invention will be better appreciated with reference to FIG. 11. While, for purposes of simplicity of explanation, the methodology of FIG. 11 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 11 illustrates an example of a method 500 for calculating an acceleration (e.g., the acceleration ACC). At 502, a charge is provided to each of a first electrode assembly (e.g., the first electrode assembly 15) and a second electrode assembly (e.g., the second electrode assembly 16) associated with an accelerometer sensor (e.g., the accelerometer sensor 12) based on a first voltage (e.g., the positive voltage $V_+$) having a positive amplitude. The first and second electrode assemblies can be arranged opposite an inertial mass (e.g., the inertial mass 14). At 504, first pickoff voltages (e.g., the voltages $V_{1\_2}$ and $V_{2\_1}$) associated with the respective first and second electrode assemblies are measured in a first measurement cycle. At 506, a charge is provided to the first and second electrode assemblies based on a second voltage (e.g., the negative voltage $V_-$) having an amplitude that is equal and opposite the first voltage. At 508, second pickoff voltages (e.g., the voltages $V_{1\_2}$ and $V_{2\_2}$) associated with the respective first and second electrode assemblies are measured in a second measurement cycle. At 510, an average of differences between the respective first and second pickoff voltages associated with each of the first and second measurement cycles is calculated. At 512, a displacement of the inertial mass resulting from the acceleration is calculated.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An accelerometer system comprising:
an accelerometer sensor comprising a first electrode configuration, a second electrode configuration, and an inertial mass between the first and second electrode configurations, the accelerometer sensor being fabricated as symmetrically arranged about each of three orthogonal mid-planes associated with the accelerometer sensor; and
an accelerometer controller configured to apply control signals that correspond to a first and second voltage that have equal and opposite amplitudes to each of the first and second electrode configurations to provide respective forces to maintain the inertial mass at a null position between the first and second electrode configurations, the accelerometer controller being further configured to measure a first pickoff signal and a second pickoff signal associated with the respective first and second electrode configurations, the first and second pickoff signals being indicative of a displacement of the inertial mass relative to the null position, and to calculate an acceleration based on the first and second pickoff signals.

2. The system of claim 1, wherein the first electrode configuration is fabricated from a first silicon-on-insulator (SOI) wafer layer, the second electrode configuration is fabricated from a second SOI wafer layer, and the inertial mass is fabricated from a semiconductor wafer layer.

3. The system of claim 1, wherein each of the first electrode configuration and the second electrode configuration comprises electrical connections that are arranged to provide a substantially uniform electrical charge distribution with respect to the first electrode configuration and the second electrode configuration.

4. The system of claim 1, wherein each of the first electrode configuration and the second electrode configuration comprises a pattern of grooves etched therein to provide airflow to a periphery of the respective first and second electrode configurations in response to displacement of the inertial mass.

5. An accelerometer system comprising:
an integrated circuit (IC) chip configured as an accelerometer sensor comprising a first electrode configuration, a second electrode configuration, and an inertial mass between the first and second electrode configurations;
an accelerometer controller configured to apply control signals that correspond to a first and second voltage that have equal and opposite amplitudes to each of the first and second electrode configurations to provide respective forces to maintain the inertial mass at a null position between the first and second electrode configurations, the accelerometer controller being further configured to measure a first pickoff signal and a second pickoff signal associated with the respective first and second electrode configurations, the first and second pickoff signals being indicative of a displacement of the inertial mass relative to the null position, and to calculate an acceleration based on the first and second pickoff signals;
a mounting interposer on which the IC chip is mounted via a mechanically compliant adhesive along a first plane that separates the IC chip and the mounting interposer, the adhesive being arranged in a pattern that is symmetric about two orthogonal planes that are orthogonal to the first plane, the mounting interposer is fabricated from a non-electrically conductive material having a thermal expansion characteristic that is approximately equal to the IC chip; and
an accelerometer case that at least partially encloses the IC chip, the accelerometer controller, and the mounting interposer, the mounting interposer being mounted on a surface of the accelerometer case via the mechanically compliant adhesive, such that the mounting interposer interconnects the IC chip and the accelerometer case.

6. The system of claim 5, wherein the IC chip is mounted to the mounting interposer along a first plane that separates the IC chip and the mounting interposer in a manner that is substantially symmetric with respect to the mounting interposer about two orthogonal planes that are orthogonal to the first plane.

7. The system of claim 5, wherein the mounting interposer is mounted to the accelerometer case via an adhesive along a first plane that separates the mounting interposer and the accelerometer case, the adhesive being arranged in a pattern that is symmetric about two orthogonal planes that are orthogonal to the first plane.

8. The system of claim 5, wherein the mounting interposer is mounted to the accelerometer case along a first plane that separates the mounting interposer and the accelerometer case in a manner that is substantially symmetric with respect to the accelerometer case about two orthogonal planes that are orthogonal to the first plane.

9. The system of claim 5, wherein the accelerometer case is mounted to an instrument block, and wherein the accelerometer case is formed of a same material as the instrument block.

10. A method for calculating an acceleration, the method comprising:
providing a charge to each of a first electrode assembly and a second electrode assembly associated with an accelerometer sensor based on a first voltage having a positive amplitude, the first and second electrode assemblies being arranged opposite an inertial mass;
measuring first pickoff voltages associated with the respective first and second electrode assemblies in a first measurement cycle;
providing a charge to the first and second electrode assemblies based on a second voltage having an amplitude that is equal and opposite the first voltage;
measuring second pickoff voltages associated with the respective first and second electrode assemblies in a second measurement cycle;
calculating an average of differences between the respective first and second pickoff voltages associated with each of the first and second measurement cycles; and
calculating a displacement of the inertial mass resulting from the acceleration.

11. The method of claim 10, wherein providing the charge to each of the first and second electrode assemblies comprises sequentially providing the charge to each of the first and second electrode assemblies via a first charge amplifier assembly and a second charge amplifier assembly, respectively.

12. The method of claim 11, wherein sequentially providing the charge comprises sequentially providing the charge to each of the first and second electrode assemblies via a switching system at an input of each of the first and second charge amplifier assemblies in response to a switching signal.

13. The method of claim 11, wherein sequentially providing the charge comprises
providing one of the first and second voltage to a first input of a first amplifier of the first charge amplifier system, the first amplifier having a second input configured to receive an amplifier feedback voltage associated with a respective one of the first and second voltages and an output that is coupled to a first input of a second amplifier of the first charge amplifier system, the second amplifier having an output configured to provide the charge to the first electrode assembly in response to the one of the first and second voltage; and
providing one of the first and second voltage to a first input of a first amplifier of the second charge amplifier system that is configured substantially similar to the first charge amplifier system, a second amplifier of the second charge amplifier system having an output configured to provide the charge to the second electrode assembly in response to the one of the first and second voltage.

14. The method of claim 11, wherein measuring the first pickoff voltages comprises measuring the first pickoff voltages at an output of the first charge amplifier system, and wherein measuring the second pickoff voltages comprises measuring the second pickoff voltages at an output of the second charge amplifier system.

15. An accelerometer system comprising:
an accelerometer sensor comprising a first electrode configuration, a second electrode configuration, and an inertial mass between the first and second electrode configurations; and
an accelerometer controller comprising:
a signal generator comprising a first charge amplifier system configured to generate a first voltage to provide a first charge on the first electrode configuration in response to an input voltage and a second charge amplifier system configured to generate a second voltage having an amplitude that is equal and opposite to the an amplitude of the first voltage to provide a second charge on the second electrode configuration in response to the input voltage to maintain the inertial mass at a null position between the first and second electrode configurations, each of the first and second charge amplifier systems comprising a first amplifier and a second amplifier in a cascaded arrangement; and
an acceleration processor configured to calculate an acceleration based on a first pickoff signal associated with the first charge and a second pickoff signal associated with the second charge, the first and second pickoff signals being indicative of a displacement of the inertial mass relative to the null position.

16. The system of claim 15, wherein the accelerometer controller further comprises a switching system configured to sequentially provide the input voltage to each of the first and second charge amplifier systems.

17. The system of claim 16, wherein the switching system comprises a switch configured to sequentially provide the input voltage to each of the first and second charge amplifier systems in response to a switching signal to provide the respective first and second pickoff signals.

18. The system of claim 17, wherein the switch is a first switch that is responsive to a first switching signal, wherein the switching system further comprises a second switch configured to sequentially provide the input voltage as a positive voltage and a negative voltage that are equal and opposite a zero voltage in a first measurement cycle and a second measurement cycle, respectively, in response to a second switching signal, wherein a measurement system is configured to measure the first and second pickoff signals associated with the respective first and second electrode configurations at each of the first and second measurement cycles, wherein the accelerometer controller further comprises an acceleration processor configured to calculate an average of a first difference between the first and second pickoff signals in the first measurement cycle and a second difference between the first and second pickoff signals in the second measurement cycle, the acceleration processor being further configured to calculate the acceleration based on the average.

19. The system of claim 16, wherein the first amplifier of each of the first and second charge amplifier systems is configured to receive a feedback signal associated with a respective one of the first and second voltages at a first input and the input voltage at a second input, and wherein the second amplifier is configured to receive the feedback signal at a first input and an output signal associated with the first amplifier at a second input, the second amplifier being configured to generate the respective one of the first and second voltages at an associated output.

\* \* \* \* \*